United States Patent
Rieken et al.

(10) Patent No.: US 12,360,145 B2
(45) Date of Patent: *Jul. 15, 2025

(54) WIRELESS SYNCHRONIZED MEASUREMENTS IN POWER DISTRIBUTION NETWORKS

(71) Applicant: Aclara Technologies LLC, St. Louis, MO (US)

(72) Inventors: David Rieken, O'Fallon, MO (US); Roger Smith, Gibsonia, PA (US)

(73) Assignee: Aclara Technologies LLC, St. Louis, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/195,906

(22) Filed: May 10, 2023

(65) Prior Publication Data
US 2023/0280383 A1    Sep. 7, 2023

Related U.S. Application Data

(63) Continuation of application No. 17/112,548, filed on Dec. 4, 2020, now Pat. No. 11,680,967.
(Continued)

(51) Int. Cl.
*G01R 25/00* (2006.01)
*G01R 21/133* (2006.01)
(Continued)

(52) U.S. Cl.
CPC ........... *G01R 25/00* (2013.01); *G01R 21/133* (2013.01); *H04B 3/54* (2013.01); *H04W 84/18* (2013.01)

(58) Field of Classification Search
CPC ........ G01R 25/00; G01R 21/133; H04B 3/54; H04W 84/18
See application file for complete search history.

(56) References Cited

U.S. PATENT DOCUMENTS

2011/0102261 A1* 5/2011 Egri .................. H01Q 1/28
342/368
2013/0051446 A1 2/2013 Mjayasankar et al.
(Continued)

FOREIGN PATENT DOCUMENTS

WO    2013/025836 A1    2/2013

OTHER PUBLICATIONS

Extended European Search Report dated Oct. 11, 2023 for corresponding European Application No. 20896458.5.
(Continued)

*Primary Examiner* — Akm Zakaria
(74) *Attorney, Agent, or Firm* — Michael Best & Friedrich LLP

(57) ABSTRACT

A system for determining a phase of a power supply coupled to a metering device. The system includes a collection device in electronic communication with a metering device connected to a power distribution network and having a memory and one or more electronic processors. The electronic processors are configured to receive a first beacon signal and measure a phasor in response to receiving the first beacon signal. The phasor is stored in the memory along with an identification value associated with the device that transmitted the first beacon signal and a first time. The electronic processors receive a second beacon signal, and extract data from the request message. The electronic processors determine whether the extracted time matches the first time and based on determining that the extracted time matches the first time stored in the memory, calculate a phase by comparing the reference phasor data to the stored phasor.

20 Claims, 5 Drawing Sheets

Related U.S. Application Data

(60) Provisional application No. 62/944,010, filed on Dec. 5, 2019.

(51) Int. Cl.
  *H04B 3/54* (2006.01)
  *H04W 84/18* (2009.01)

(56) References Cited

U.S. PATENT DOCUMENTS

| | | | | |
|---|---|---|---|---|
| 2013/0110425 A1* | 5/2013 | Sharma | ............. | H02J 13/00028 |
| | | | | 702/62 |
| 2013/0241746 A1* | 9/2013 | McKinley | .............. | G01R 29/18 |
| | | | | 340/870.02 |
| 2015/0253367 A1* | 9/2015 | Flammer, III | .... | H02J 13/00017 |
| | | | | 324/76.77 |
| 2016/0021500 A1* | 1/2016 | Won | ...................... | H04W 4/021 |
| | | | | 455/456.2 |
| 2016/0154040 A1 | 6/2016 | Driscoll et al. | | |
| 2016/0198245 A1 | 7/2016 | Rhoads et al. | | |
| 2017/0063156 A1* | 3/2017 | Williams | ........... | G01R 31/3646 |
| 2018/0031617 A1 | 2/2018 | Rieken et al. | | |
| 2018/0159373 A1 | 6/2018 | Williams et al. | | |

OTHER PUBLICATIONS

PCT/US2020/063373 International Search Report and Written Opinion dated Mar. 3, 2021 (18 pages).

Chinese Patent Application No. 202080095017.3 First Office Action Issued by the China National Intellectual Property Administration dated Mar. 11, 2025, 7 pages.

* cited by examiner

WIRELESS SYNCHRONIZED MEASUREMENTS IN POWER DISTRIBUTION NETWORKS

CROSS-REFERENCE TO RELATED APPLICATIONS

This application claims priority to and the benefit of U.S. patent application Ser. No. 17/112,548, filed Dec. 4, 2020, which claims priority to and the benefit of U.S. Provisional Patent Application No. 62/944,010, filed Dec. 5, 2019. The contents of both are incorporated by reference herein.

FIELD

The embodiments disclosed herein relate to wireless synchronization systems and methods for measuring phasors in power distribution networks.

BACKGROUND

Conventional phasor measurement units (PMUs) generally use wired connections such as power line communication (PLC) to communicate between phasor measurement devices and the data recorders. Typically, a synchronization signal may be communicated from the data recorders to the phasor measurement devices, which may then transmit a signal back via the PLC system to allow for relative phases to be calculated. However, this can result in a heavy burden being placed on the communication network. Further, it is cumbersome to apply this sort of architecture to the transmission side due to the high cost of equipment that is required to handle the high voltage levels on the transmission network.

SUMMARY

According to one aspect, a system for determining a phase of a power source coupled to a metering device is described. The system includes a number of collection devices, each of the collection devices in electronic communication with a metering device connected to a power distribution network and having a memory and one or more electronic processors. The electronic processors are configured to receive a first beacon signal and measure a phasor of a power source coupled to the metering device in response to receiving the first beacon signal. The electronic processors are further configured to store the measured phasor, an identification value associated with the device that transmitted the first beacon signal, and a first time in the memory. The electronic processors are also configured to receive a second beacon signal, the second beacon signal comprising a request message, and to extract data from the request message, wherein the extracted data includes a time data value and a reference phasor value. The electronic processors are further configured to determine whether the extracted time data value matches the first time stored in memory, and based on determining that the extracted time matches the first time stored in the memory, the electronic processors are configured to calculate a phase by comparing the reference phasor value to the stored measured phasor.

According to another aspect, a system is provided for determining a phase of a power supply coupled to a metering device connected to a power distribution network. The system includes a number of collection device, wherein each of the collection devices are in electronic communication with a metering device connected to a power distribution network. The collection devices have a memory and one or more electronic processors. The electronic processors are configured to receive a first beacon signal, measure a phasor based on receiving the first beacon signal, and store the phasor in the memory along with an identification value associated with the device that transmitted the first beacon signal and a first time. The electronic processors are further configured to receive a second beacon signal, wherein the second beacon signal includes a request message. The electronic processors are further configured to extract data from the request message, wherein the extracted data includes a time data value. The electronic processors are further configured to determine if the extracted time matches the first time stored in the memory, and, based on determining that the extracted time matches the first time stored in the memory, transmit a response data packet comprising the stored phasor, the stored identification value, and the first time to a data collection unit.

According to another aspect, a method for determining a phase of a power supply coupled to a metering device is described. A first collection device is in electronic communication with the metering device, and includes a memory and one or more electronic processors. The method includes receiving a first beacon signal at the first collection device, and measuring, via the collection device, a phasor of a power signal at the metering device in response to receiving the first beacon signal. The method also includes storing the measured phasor, a first time, and an identification value associated with the device that transmitted the first beacon signal in the memory. The method also includes receiving a second beacon signal at the first collection device, and extracting data from the request message by the first collection device. The extracted data includes a time data value and a reference phasor value. The method also includes determining, by the first collection device, whether the extracted time data value matches the first time stored in the memory, and calculating, by the first collection device, the phase of the power line connected to the metering device by comparing the reference phasor data to the stored measured phasor.

Other aspects of the technology will become apparent by consideration of the detailed description and accompanying drawings.

DETAILED DESCRIPTION

Before any embodiments of the application are explained in detail, it is to be understood that the application is not limited in its application to the details of construction and the arrangement of components set forth in the following description or illustrated in the following drawings. The application is capable of other embodiments and of being practiced or of being carried out in various ways.

Figure 1:
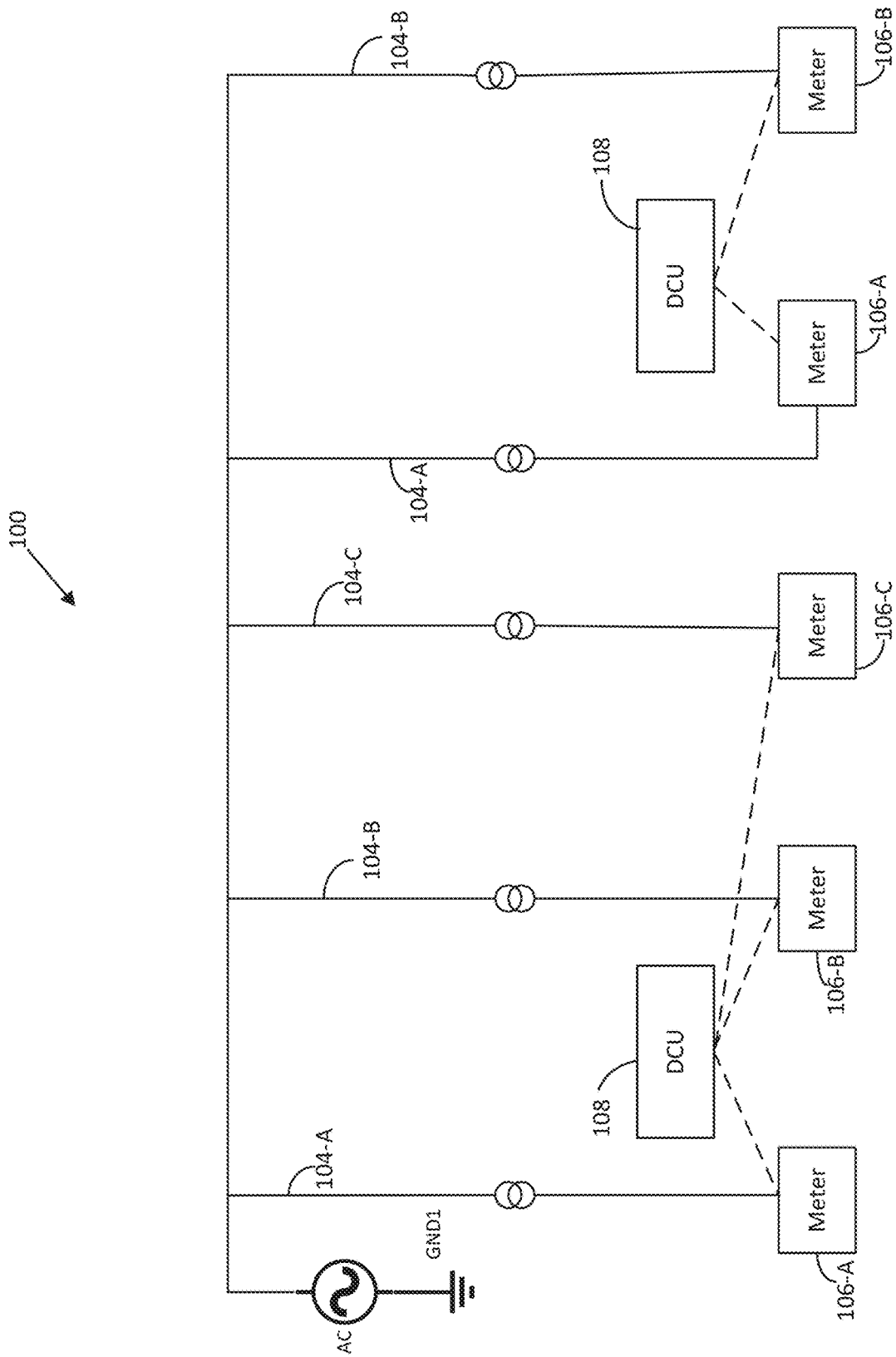
FIG. 1 is a block diagram illustrating one exemplary embodiment of a phasor measurement system, according to the description.

FIG. 1 illustrates an example synchronized phasor (i.e., synchrophasor) measurement system 100, in accordance with an embodiment of the disclosure. The synchronized phasor measurement system 100 include a power distribution network 104 and metering devices 106. The system 100 may further include one or more data collection units ("DCU") 108. The metering devices 106 may be mechanically, electrically, and/or communicatively connected to aspects of the power distribution network 104. As illustrated in FIG. 1, the metering devices 106 may be connected to transformers (e.g., distribution transformers that step down medium voltage to low voltage). The metering devices 106 may be residential metering devices, commercial metering devices, industrial metering devices, etc. The DCUs 108 may be wirelessly connected to the metering devices 106 to facilitate communication between the DCUs 108 and the metering devices 106. For example, a DCU 108 may be connected to one or more metering devices using wireless protocols, such as cellular (e.g. 3G, 4G, LTE, CDMA, etc.), RF, or other applicable wireless protocols.

In one embodiment, the power distribution network 104 comprises distribution lines each adapted to carry electric power having different wiring phases. For example, a distribution line 104-A may be adapted to carry electric power having Phase A to one or more metering devices 106-A, a distribution line 104-B may be adapted to carry electric power having Phase B to one or more metering devices 106-B, and a distribution line 104-C may be adapted to carry electric power having Phase C to one or more metering devices 106-C. In one exemplary embodiment, distribution lines of the power distribution network 104 may carry electric power having a combination of Phase A, Phase B, and/or Phase C to metering devices 106-C. For example, when the system includes delta-Y and/or Y-delta transformers the phases of the outputs of these transformers will not be pure Phase A, Phase B, or Phase C, but instead may be a combination of Phase A, Phase B, and/or Phase C.

The metering devices 106 may be placed on the power distribution network 104 wherever synchronous phasor measurements are to be made. In some embodiments, the metering devices 106 may include a collection device capable of wirelessly communicating with one or more DCUs 108. In some embodiments, the DCUs 108 are placed at multiple locations within the system 100 to facilitate communication with the metering devices 106 as needed. In some embodiments, the DCUs 108 may be located every 5-10 miles to ensure communication with the metering devices 106. In some examples, the DCUs 108 may be mounted to power line poles at specified intervals to ensure proper coverage.

Figure 2:
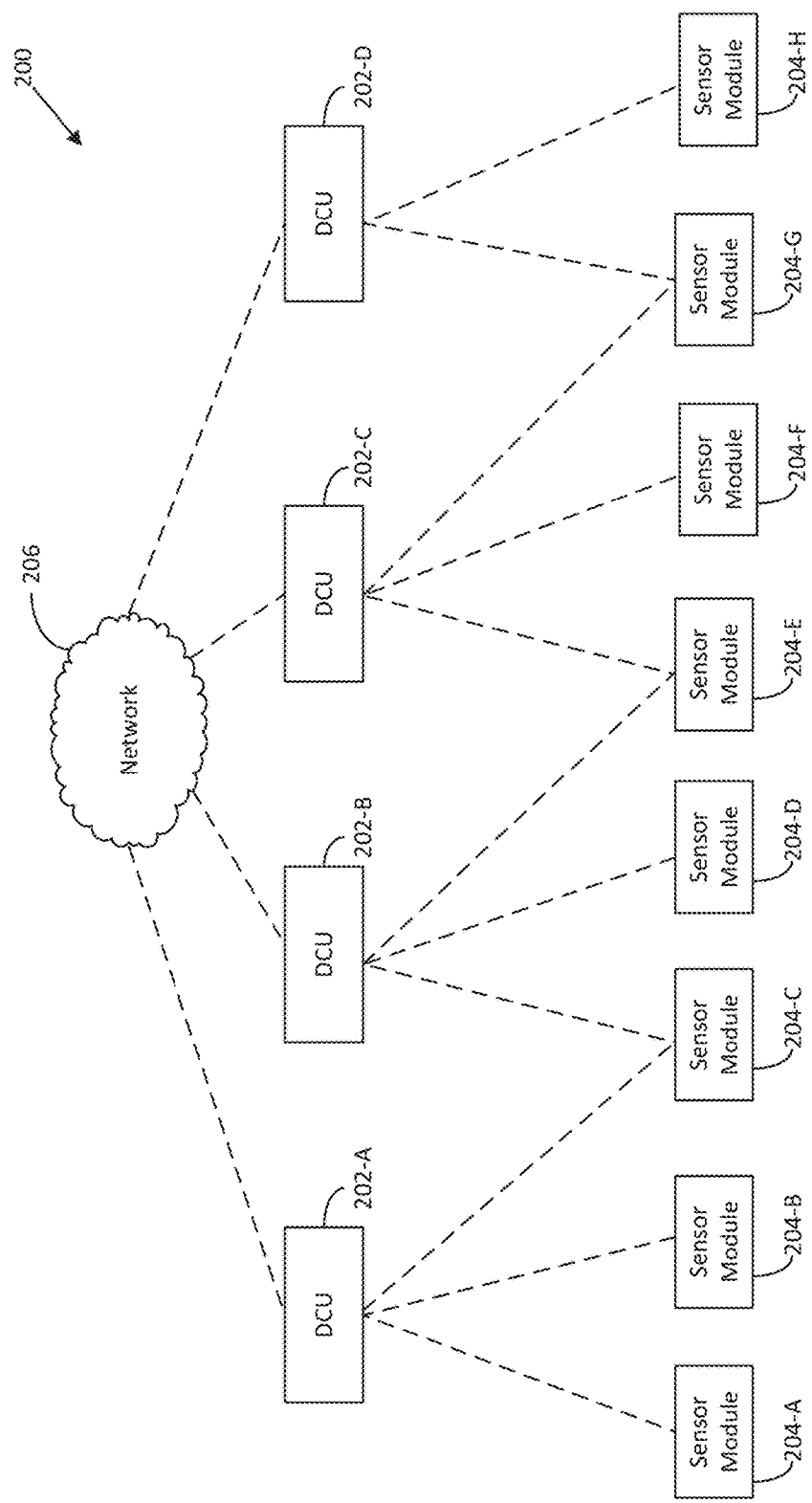
FIG. 2 is a system diagram illustrating one exemplary embodiment of a phasor measurement system, according to the description.

Turning now to FIG. 2, a network diagram of a power distribution equipment communication network 200 is shown, according to some embodiments. As shown in FIG. 1 a number of DCUs 202 are shown to be in wireless communication with a number of sensor modules 204. In one embodiment, the DCUs 202 are similar to the DCUs 108, described above. The sensor modules 204 are configured to receive a communication from the DCUs 202 and subsequently transmit a return message to the DCU 202, as will be described in more detail below. It is understood that the term sensor modules can be used interchangeably with the term collection device, as used herein. In one embodiment, the sensor modules 204 are coupled to a meter, such as meters 106 described above. The sensor modules 204 may be configured to determine phase data or other waveform data via the coupled meters (not shown). While the sensor modules 204 are generally described as being coupled to meters, it is contemplated that the sensor modules 204 may be integrated into the meters.

As shown in FIG. 2, the DCUs 202 are also shown as in communication with a network 206. The network 206 may be a cloud-based or Internet-based network. However, other network types, such as local area networks (LAN), are also contemplated. In one embodiment, the DCUs 202 are in wireless communication with the network 206. However, in some embodiments, the DCUs 202 communicate with the network 206 via a wired connection, as will be described in more detail below. In one embodiment, the network 206 is configured to be a data storage network. In other embodiments, the network 206 is configured to perform one or more functions, such as determining one or more reference phasor values and/or phasor differences across the distribution system.

As further shown in FIG. 2, each DCU 202 may be in communication with one or more sensor modules 204. Furthermore, a single sensor module 204 may be in communication with one or more DCUs 202. For example, sensor module 204-C may be in communication with both DCU 202-A and DCU 202-B; sensor module 204-E may be in communication with both DCU 202-B and DCU 202-C; and sensor module 204-G may be in communication with DCU 202-C and 202-D. In one embodiment, the DCUs 202 and the sensor modules 204 communicate via a radio frequency (RF) communication protocol, although other wireless communication protocols are also considered. The messages sent between the DCUs 202 and the sensor modules 204 may be sent as general broadcasts using the RF communication protocol such that they may be received by any DCU 202 and/or sensor module 204 within range. Thus, different sensor modules 204 may communicate with different DCUs 202 based on various conditions affecting the RF signal, such as distance, weather, obstructions, atmospheric conditions, etc.

Figure 3:
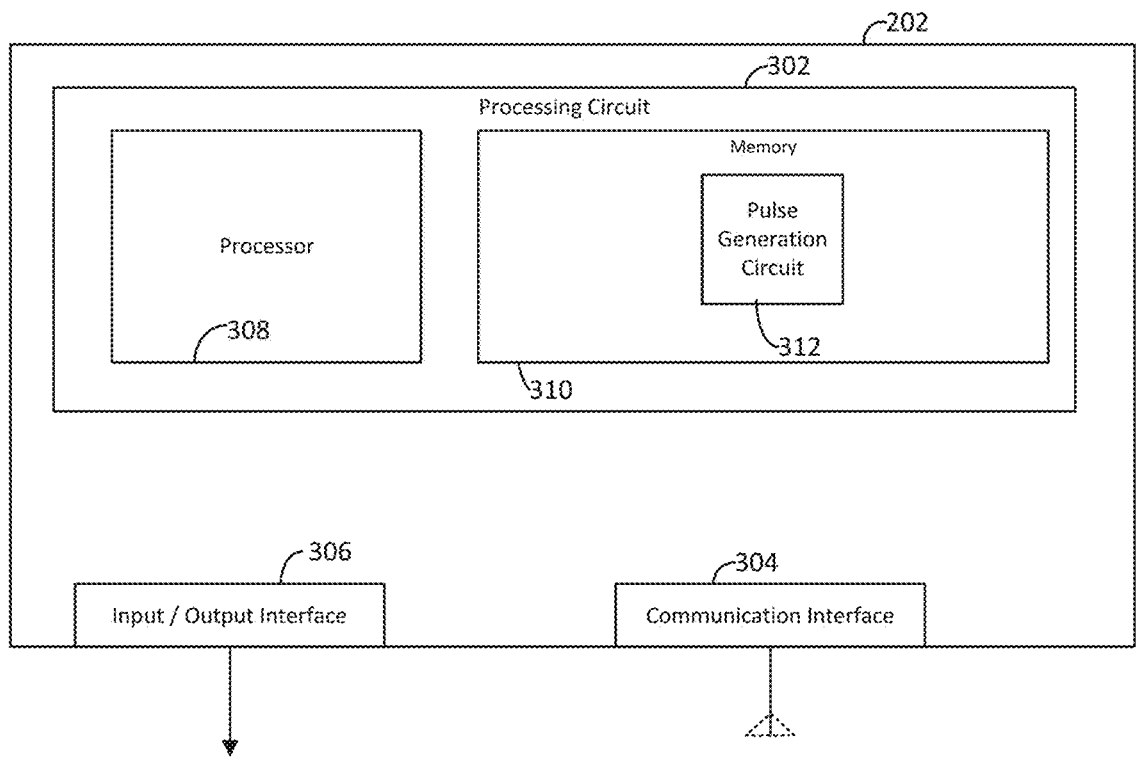
FIG. 3 is a block diagram illustrating one exemplary embodiment of the synchronizer devices of FIGS. 1 and 2, according to the description.

Turning now to FIG. 3, a block diagram of a DCU 202 is shown, according to some embodiments. The DCU 202 may be a standalone device, or may be a part of one or more devices, such as power meters 106, switchgear, etc. As shown in FIG. 3, the DCU 202 includes a processing circuit 302, a communication interface 304, and an input/output (I/O) interface 306. The processing circuit 302 includes an electronic processor 308 and a memory 310. The processing circuit 302 may be communicably connected to one or more of the communication interface 304 and the I/O interface 306. The electronic processor 308 may be implemented as a programmable microprocessor, an application specific integrated circuit (ASIC), one or more field programmable gate arrays (FPGA), a group of processing components, or with other suitable electronic processing components.

The memory 310 (for example, a non-transitory, computer-readable medium) includes one or more devices (for example, RAM, ROM, flash memory, hard disk storage, etc.) for storing data and/or computer code for completing or facilitating the various processes, layers, and modules described herein. The memory 310 may include database components, object code components, script components, or other types of code and information for supporting the various activities and information structure described in the present application. According to one example, the memory 310 is communicably connected to the electronic processor 308 via the processing circuit 302 and may include computer code for executing (for example, by the processing circuit 302 and/or the electronic processor 308) one or more processes described herein.

The communication interface 304 is configured to facilitate communication between the DCU 202 and one or more external devices or systems, such a sensor module 204 or the network 206. The communication interface 304 may be, or include, wireless communication interfaces (for example, antennas, transmitters, receivers, transceivers, etc.) for conducting data communications between the DCU 202 and one or more external devices, such as the sensor modules 204 and/or the network 206. In some embodiments, the communication interface 304 utilizes a proprietary protocol for communicating with the sensor modules 204 and/or network 206. For example, the proprietary protocol may be an RF-based protocol configured to provide efficient and effective communication between the DCU 202 and other devices. In other embodiments, other wireless communication protocols may also be used, such as cellular (3G, 4G, 5G, LTE, CDMA, etc.), Wi-Fi, LoRa, LoRaWAN, Z-wave, Thread, and/or any other applicable wireless communication protocol.

The I/O module 306 may be configured to interface directly with one or more devices, such as a power supply, a power monitor, etc. In one embodiment, the I/O module may utilize general purpose I/O (GPIO) ports, analog inputs, digital inputs, etc.

As described above, the memory 310 may be configured to store various processes, layers, and modules, which may be executed by the electronic processor 308 and/or the processing circuit 302. In one embodiment, the memory 310 includes a pulse generation circuit 312. The pulse generation circuit 312 is adapted to generate a synchronization pulse for establishing a common time reference between DCU 202 and one or more sensor modules 204. In one embodiment, the synchronization pulse is transmitted via the communication interface 304, such as via the wireless communication protocols described above.

Figure 4:
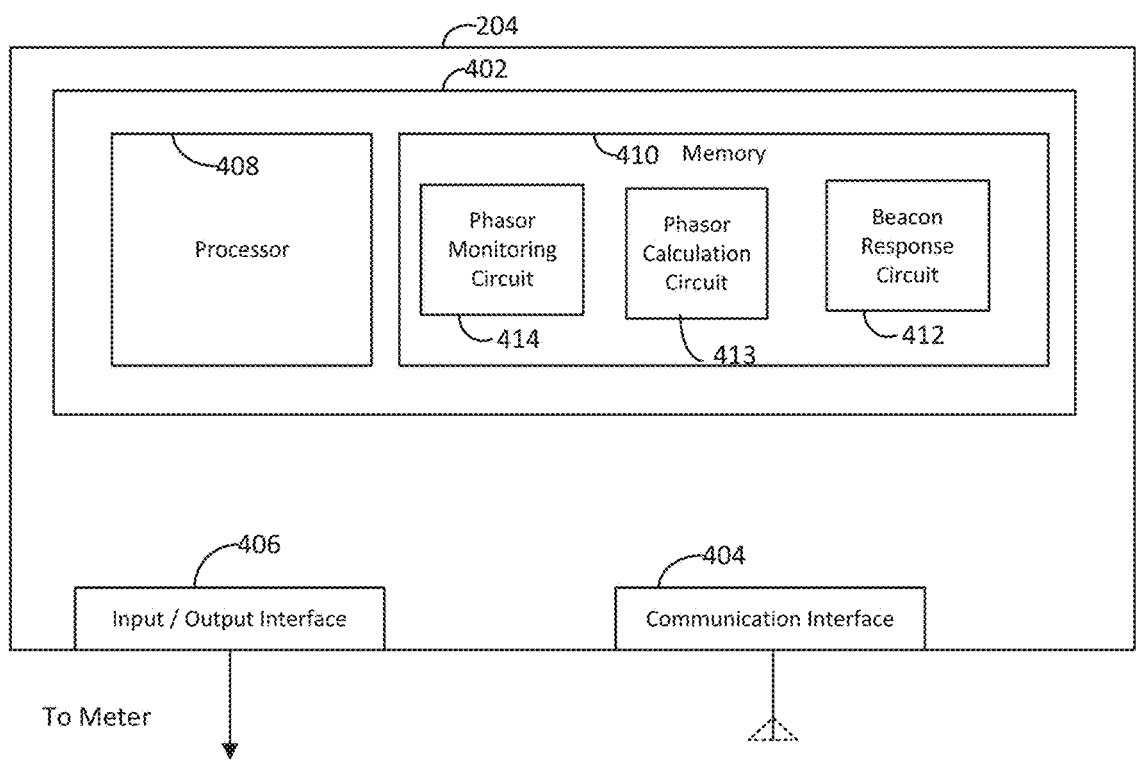
FIG. 4 is block diagram illustrating one exemplary embodiment of the sensor module devices of FIGS. 1 and 2, according to some embodiments, according to the description.

Turning now to FIG. 4, a block diagram of a sensor module 204 is shown, according to some embodiments. The sensor module 204 may be a standalone device, or may be a part of one or more devices, such as a power meter. As shown in FIG. 4, the sensor module 204 includes a processing circuit 402, a communication interface 404, and an input/output (I/O) interface 406. The processing circuit 402 includes an electronic processor 408 and a memory 410. The processing circuit 402 may be communicably connected to one or more of the communication interface 404 and the I/O interface 406. The electronic processor 408 may be implemented as a programmable microprocessor, an application specific integrated circuit (ASIC), one or more field programmable gate arrays (FPGA), a group of processing components, or with other suitable electronic processing components.

The memory 410 (for example, a non-transitory, computer-readable medium) includes one or more devices (for example, RAM, ROM, flash memory, hard disk storage, etc.) for storing data and/or computer code for completing or facilitating the various processes, layers, and modules described herein. The memory 410 may include database components, object code components, script components, or other types of code and information for supporting the various activities and information structure described in the present application. According to one example, the memory 410 is communicably connected to the electronic processor 408 via the processing circuit 402 and may include computer code for executing (for example, by the processing circuit 402 and/or the electronic processor 408) one or more processes described herein.

The communication interface 404 is configured to facilitate communication between the sensor module 204 and one or more external devices or systems, such a DCU 202. The communication interface 404 may be or include wireless communication interfaces (for example, antennas, transmitters, receivers, transceivers, etc.) for conducting data communications between the sensor module 204 and one or more external devices, such as the DCUs 202. In some embodiments, the communication interface 404 utilizes a proprietary protocol for communicating with the DCUs 202. For example, the proprietary protocol may be an RF-based protocol configured to provide efficient and effective communication between the DCUs 202 or other devices. In other embodiments, other wireless communication protocols may also be used, such as cellular (3G, 4G, 5G, LTE, CDMA, etc.), Wi-Fi, LoRa, LoRaWAN, Z-wave, Thread, and/or any other applicable wireless communication protocol.

The I/O interface 406 may be configured to interface directly with one or more devices, such as a power supply, a meter, etc. In one embodiment, the I/O interface 406 may utilize general purpose I/O (GPIO) ports, analog inputs, digital inputs, etc.

As described above, the memory 410 may be configured to store various processes, layers, and modules, which may be executed by the electronic processor 408 and/or the processing circuit 402. In one embodiment, the memory 410 includes a beacon response circuit 412. The beacon response circuit 412 is adapted to generate a response beacon for providing a response to an interrogation beacon from one or more DCUs 202. As described in more detail below, the beacon response may receive a time stamp of when an interrogation beacon was received. The beacon response may further include a phase of a sinusoid, such as a reference sinusoid, at the time the interrogation beacon was received. In one embodiment, the response beacon is transmitted using the communication interface 404, such as via the wireless communication protocols described above. The memory 410 may further include a phasor calculation circuit 413. The phasor calculation circuit 413 may be configured to determine various phasor data of the distribution network, such as a reference phasor as well as variations in phasors across the distribution network, as will be described in more detail below.

The memory 410 further includes a phase monitoring circuit 414. The phase monitoring circuit 414 may be configured to determine a phase at a meter associated with the sensor module 204, as will be described in more detail below.

Figure 5:
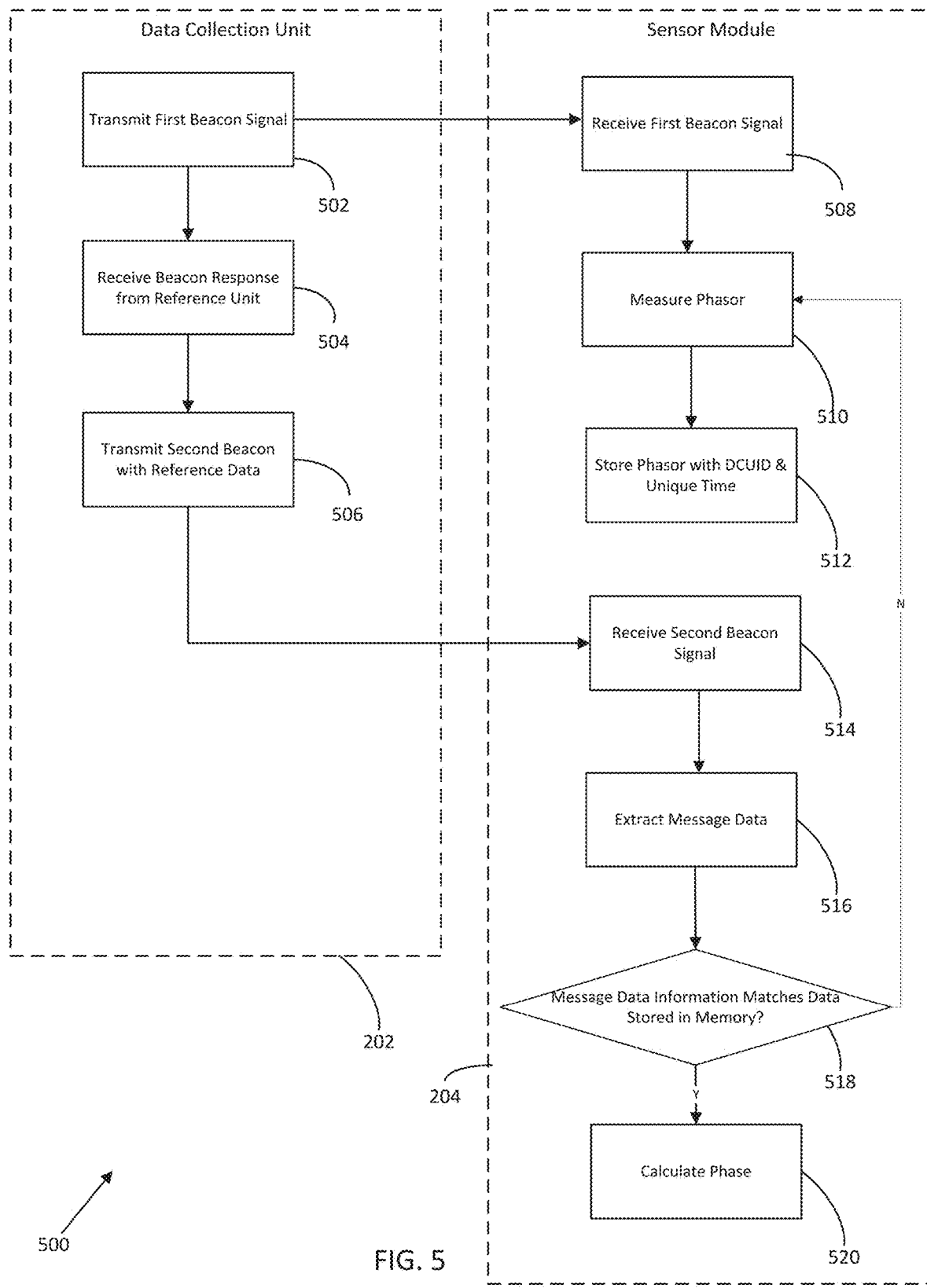
FIG. 5 is a flow chart illustrating one exemplary embodiment of a method for determining phase information at a collection device, according to the description.

Turning now to FIG. 5, a process for determining phasor data across a distribution network at the metering devices is shown, according to some embodiments. Determining phasor data across a distribution network may allow for the integrity of the distribution network to be verified or validated and may provide an indication when there are issues on the distribution network, which could indicate a risk of power loss on the network. Further, by determining phasor data across the distribution network, a loading of each phases (e.g. A, B, C) on the network may be evaluated to determine if there are imbalances in the loading of the distribution network. Also, by determining phasor data across the network, other system issues, such as failing system components, failing transformers, failing cables, floating neutrals, and other conditions may be detected and tracked. Additionally, the information provided to the utility by the phasor data can allow for more precise control of network components, such as capacitor banks, voltage regulators, and distribution of automation across a smart grid.

In one embodiment, the process 500 is performed by a combination of DCUs, such as the DCUs 202 and a sensor module, such as sensor module 204. However, in other embodiments, the process 500 may be performed via other components within the distribution network. Further, it is contemplated that the process 500 may be performed by multiple DCUs 202 within the distribution system.

At process block 502, the DCU 202 transmits a first beacon signal that is received by one or more sensor modules 204. At process block 504, the DCU 202 receives a beacon response from a reference unit. In one embodiment, a reference unit is a device (e.g. meter/sensor module) that has a known phase. In some embodiments, the phase may be noted during installation of the reference unit, and a flag or other identifier may be set within the reference unit such that it can broadcast the phase it is connected to when transmitting data. In some embodiments, there may be many different references devices throughout a power network, such that each of the phases (A, B, C) has multiple associated reference devices. Upon receiving the beacon response from at least one reference unit, the DCU 202 then transmits a second beacon containing the received reference data from the reference unit.

In some embodiments, the reference unit may be determined via an algorithm of executed by a central computer, such as network 206. In this approach, a small sample of the total number of sensor modules 204 that received the first beacon signal transmit their measured phasors back to the DCU 202. The DCU 202 may then send the received phasors to the network 206. The network 206 may then use one or more algorithms to determine what the phase angle would be at an ideal unit (which may not actually exist) that is attached to a nominal phase. This determined value is then used as the reference data for transmission in the second beacon. In one example, the network 206 may transmit the reference data to the DCU 202 for use in generating the second beacon, as described above.

At process block 508, a sensor module 204 receives the first beacon. It is understood that multiple sensor modules 204 may receive the first beacon, and therefore each sensor module 204 that receives the subsequent signal would be understood to perform the following functions. Upon receiving the first beacon the sensor module 204 measures a phasor at that instant at process block 510. At process block 512, the sensor module 204 stores the measured phasor in the memory of the sensor module 204, along with the time the beacon signal was received and an identification value of the DCU that transmitted the first beacon signal.

The sensor module 204 then receives the second beacon containing the reference data at process block 514. Upon receiving the second beacon signal, the sensor module 204 extracts message data from the second beacon signal (if any) at process block 516. Extracted message data may include reference data, time associated with the reference data (e.g. time reference data was measured), identification (ID) of the DCU transmitting the message, etc. Upon extracting the message data, the sensor module 204 determines whether the message data information corresponds to data stored in the memory of the sensor module 204, at process block 518. For example, the sensor module 204 may determine if the time and ID of the DCU in the message match the time and ID of the DCU associated with the first beacon signal received by the sensor module 204 at process block 508.

In response to determining that the message received in the second beacon signal included the same time and DCU ID of a previous beacon (e.g. the first beacon signal), the sensor module 204 calculates a phase of the power line connected to the sensor module 204 and/or a meter associated with the sensor module 204 at process block 520. In one embodiment, the sensor module 204 calculates the phase by subtracting the reference phasor received in the second beacon from the phasor measured by the sensor module 204 at the time the first beacon was received in process block 508 to determine a phase angle difference. Accordingly, the sensor module 204 compares the phasor measured upon receipt of the first beacon signal and stored in the memory 310 of the sensor module 204, with the reference phasor that was measured at the same time. This functionality may be necessary as a sensor module 204 may be in communication with one or more DCUs within the network, as illustrated above. Thus, by comparing the reference phasor only with data associated with the sensor module 204 receiving the same beacon signal as the reference device, it is ensured that the sensor module 204 is comparing similar data. The sensor module 204 may then determine the phase (e.g. the phase the connector is coupled to) in response to the difference between the reference phasor and the measured phasor being determined to be less than a predetermined value. For example, the predetermined value may be a phase angle difference of plus-or-minus 30 degrees. However, phase angle differences of less than plus-or-minus 30 degrees or greater than plus-or-minus 30 degrees are also contemplated. Additionally, in some examples, other predetermined values may be used other than phase angle difference values. In response to determining that the message received in the second beacon signal does not include a time and DCU ID of a previously received beacon, the sensor module 204 will simply disregard the message, and return to process block 510.

In some embodiments, the sensor module 204 may transmit the determine phase data to one of more DCUs 202. In other embodiments, the sensor modules 204 may provide the data to one or more other devices, such as a network system, such as network 206.

Figure 6:
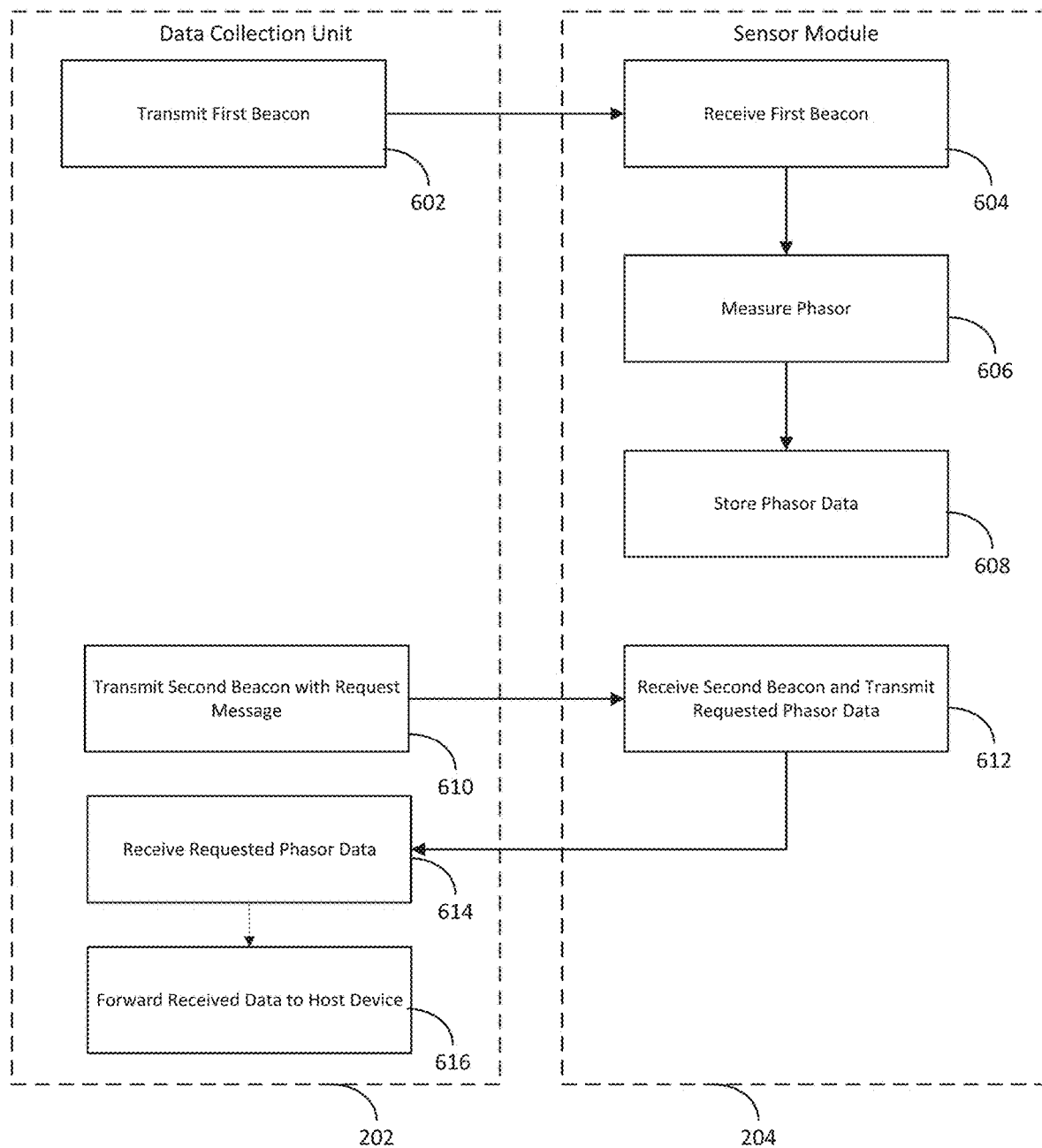
FIG. 6 is a flow chart illustrating one exemplary embodiment of a method for determining phase information for a collection device at a central host computing device, according to the description.

Turning now to FIG. 6, a process 600 for determining phase information of one or more metering devices at a network is shown, according to some embodiments. In contrast to the process 500 described above, process 600 utilizes a centralized computing system, such as a server or cloud-based system (e.g. network 206), to determine the phase of a given metering device as opposed to the metering device and/or sensor module associated with the metering device performing the determination.

At process block 602, a DCU 202 transmits a first beacon that is received by one or more sensor modules 204. At process block 604, a sensor module 204 receives the first beacon. It is understood that multiple sensor modules 204 may receive the first beacon. Upon receiving the first beacon the sensor module 204 measures a phasor at that instant at process block 606. At process block 608, the sensor module 204 stores the measured phasor in the memory 310 of the sensor module 204, along with the time the beacon signal was received and an identification value of the DCU that transmitted the first beacon signal.

At process block 610 the DCU 202 transmits a second beacon including a request to the sensor modules 204. In one embodiment, the request is an instruction to provide stored phasor data associated with a previously transmitted beacon, such as the first beacon. In other embodiments, the request may request phasor data associated with a DCU ID and a time, wherein the DCU ID and time correspond to a previously transmitted beacon, such as the first beacon. The sensor module 204 receives the beacon at process block 612 and transmits the requested phasor data if available. For example, the sensor module 204 may determine if the time and DCU ID in the request match the time and DCU ID associated with the first beacon (or any other previously received beacons) received by the sensor module 204. In response to determining that the sensor module 204 has no stored phasor data corresponding to the time and DCU ID in the request, the sensor module 204 may ignore the request. In other examples, the sensor module 204 may transmit a response to the DCU that the sensor module 204 does not have any stored phasor data corresponding to the time and DCU ID in the request.

At process block 614, the DCU 202 receives the requested phasor data from one or more sensor modules 204. In one embodiment, the requested phasor data further includes the time the phasor was measured, as well as an identification of the transmitting sensor module 204. The DCU 202 then forwards the received phasor data to a host device (e.g. server or cloud-based computing system), which then determines a phase for each of the sensor modules 204 that transmitted the phasor data. For example, the host device may use a similar method to determine a phase of the sensor module 204 using reference data, as described above. However, in other embodiments, the host device may use other methods to determine phase data for the sensor modules 204. In some embodiments, the host device may compare the phasor data provided to previous phasor data from the sensor modules 204 to determine if there is an issue or a change indicating a fault or problem in the power distribution network.

What is claimed is:

1. A system for determining a wiring phase of a power source within a utility power distribution network, the system comprising:
    a collection device in electronic communication with a metering device associated with the utility power distribution network and having a memory and one or more electronic processors configured to:
    receive a first beacon signal at a first time;
    measure a phasor of the power source coupled to the metering device in response to receiving the first beacon signal at the first time;
    receive a second beacon signal including a second time and a reference phasor value;
    determine whether the second time matches the first time; and
    calculate the wiring phase of the power source by comparing the reference phasor value to the measured phasor in response to determining that the second time matches the first time.

2. The system of claim 1, further comprising:
    a data collection unit, the data collection unit comprising a memory and one or more processors, the one or more processors configured to:
    transmit the first beacon signal;
    receive a beacon response signal from a reference collection device and extract the reference phasor value from the received beacon response; and
    transmit the second beacon signal.

3. The system of claim 2, wherein the second time is a time that the data collection unit transmits the first beacon signal.

4. The system of claim 2, wherein the first beacon signal and the second beacon signal are transmitted using a wireless communication protocol.

5. The system of claim 4, wherein the wireless communication is at least one selected from the group of cellular communication, Wi-Fi, and LoRa.

6. The system of claim 1, wherein the first time is the time the first beacon signal is received at the collection device.

7. The system of claim 1, wherein the second beacon signal further includes an identification of a device that transmitted the second beacon signal.

8. The system of claim 1, wherein the one or more electronic processors are configured to calculate the phase by determining whether a phase angle difference between the reference phasor and the measured phasor exceeds a predetermined threshold.

9. The system of claim 8, wherein the predetermined threshold is plus/minus 30 degrees.

10. A system for determining a wiring phase of a power supply coupled to a metering device connected to a power distribution network, the system comprising:
    a collection device in electronic communication with the metering device connected to a power distribution network and having a memory and one or more electronic processors configured to:
    receive a first beacon signal at a first time and including a first identification data of the device that transmitted the first beacon signal;
    measure a phasor of the power source coupled to the metering device in response to receiving the first beacon signal;
    receive a second beacon signal including a second time;
    determine whether the second time matches the first time; and
    based on determining that the second time matches the first time stored in the memory, transmit a response message including the measured phasor, the received identification value, and the first time;
    calculate the wiring phase of the power source coupled to the metering device.

11. The system of claim 10, further comprising:
    a data collection unit, comprising a memory and one or more processors, wherein the one or more processors are configured to:
    transmit the first beacon signal;
    transmit the second beacon signal;
    receive the response message; and
    transmit the response message to a host device.

12. The system of claim 11, wherein the host device is a server-based computing system.

13. The system of claim 11, wherein the second time is a time that the data collection unit transmitted the first beacon signal.

14. The system of claim 10, wherein the first time is the time the first beacon signal was received by the collection device.

15. The system of claim 10, wherein the second beacon signal further includes a second identification data associated with a device that transmitted the second beacon signal.

16. A method for determining a wiring phase of a power supply coupled to a metering device within a utility power distribution network, wherein a first collection device is in electronic communication with the metering device, and incudes a memory and one or more electronic processors, the method comprising:

receiving a first beacon signal at the first collection device at a first time;

measuring, via the first collection device, a phasor of a power signal at the metering device in response to receiving the first beacon signal;

receiving a second beacon signal at the first collection device, wherein the second beacon signal includes a second time and a reference phasor value;

determining, by the first collection device, whether the second time matches the first time; and calculating, by the first collection device, the wiring phase of the power supply connected to the metering device by comparing the reference phasor value to the measured phasor.

17. The method of claim 16, further comprising:

transmitting the first beacon signal by a data collection unit;

receiving, at the data collection unit, a beacon response signal from a reference collection device and extracting the reference phasor value from the received beacon response; and transmitting the second beacon signal.

18. The method of claim 17, wherein the second time is a time that the data collection unit transmitted the first beacon signal.

19. The method of claim 16, wherein the first time is the time the first beacon signal was received at the first collection device.

20. The method of claim 16, wherein the second beacon signal further comprises a second identification value of a device that transmitted the second beacon signal.

* * * * *